April 18, 1950 W. E. BRADLEY 2,504,636

SUPERREGENERATIVE RECEIVER CIRCUIT

Filed July 15, 1944

INVENTOR.
William E. Bradley
BY
Howson & Howson
Attys.

Patented Apr. 18, 1950

2,504,636

UNITED STATES PATENT OFFICE 2,504,636

SUPERREGENERATIVE RECEIVER CIRCUIT

William E. Bradley, Swarthmore, Pa., assignor, by mesne assignments, to Philco Corporation, Philadelphia, Pa., a corporation of Pennsylvania Application July 15, 1944, Serial No. 545,078

8 Claims. (Cl. 250—20)

Figure 1:
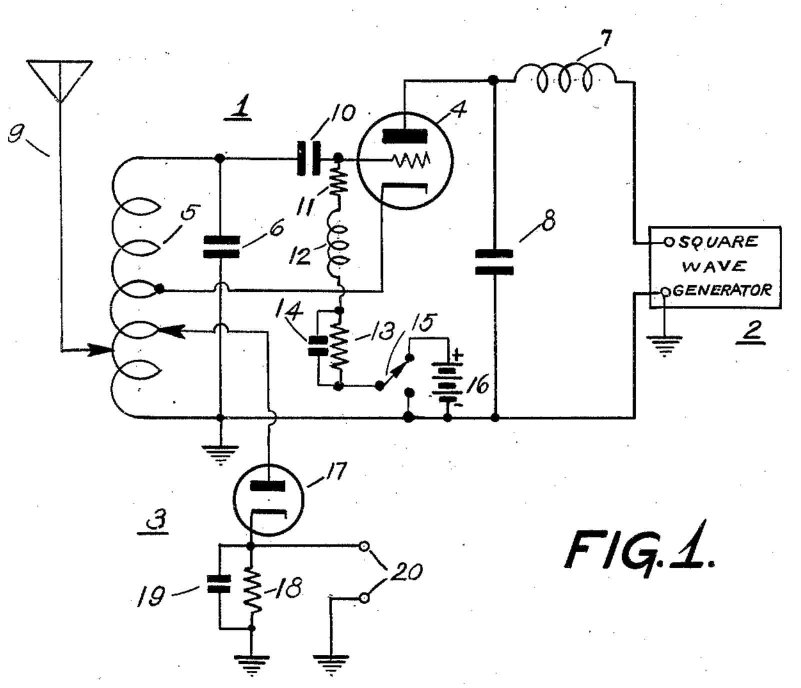

This invention relates broadly to vacuum tube oscillators. The invention also relates to superregenerative radio receivers, and more particularly to an improved superregenerative receiver having novel means for effecting automatic regeneration control. The invention includes circuit improvements which result in a mode of operation which is independent of minor circuit changes, variations in oscillator supply potentials, and signal amplitude changes.

A conventional superregenerative receiver may be characterized as a vacuum tube circuit which comprises a highly regenerative amplifier and a detector. The regenerative amplifier is made alternately oscillatory and non-oscillatory at a super-audible rate. Since the sensitivity of such a circuit is greatest when the effective resistance of the tank circuit is approximately zero, the direct current energizing and quenching potentials are normally adjusted until a mode of operation is reached such that oscillations just reach full amplitude before they are quenched. When designed for the reception of ultra-high radio frequencies the conventional superregenerative receiver has the disadvantage of being sensitive to circuit changes, such as may be produced by the replacement of tubes, variations in supply voltages, and variation in signal strength. To eliminate these difficulties the present invention provides an improved regeneration control which greatly improves the operation and stability of the superregenerative receiver.

According to the present invention, the abovementioned disadvantages of the conventional superregenerative circuit are surmounted by providing the oscillator (i. e. the regenerative amplifier) with a novel automatic grid-biasing arrangement comprising the combination of a pair of leak and condenser circuits, one of said circuits having a very short time constant while the other has a very long time constant. The leak and condenser circuit (hereinafter "R—C circuit") having the long time constant tends to maintain constant grid current, and hence tends to adjust the bias of the oscillator so as to maintain the average "starting time" of the oscillator at a constant value; this value is conveniently adjustable by adjustment of the high resistance element of the said R—C circuit. The R—C circuit having the short time constant favors the occurrence of very rapid compensatory changes in grid bias in response to changes in oscillation amplitude, sudden changes in supply voltages, or the like. In consequence the desired mode of oscillation is preserved. In the absence of this novel combination of R—C circuits, it has been found that the mode of oscillation of the oscillator may be unduly subject to supply voltage variations, circuit changes, and the like. In some instances squegging, or self-quenching, tends to occur; previously this condition had to be remedied as it occurred by manually effecting compensatory changes in certain of the circuit constants. By the present invention the necessary compensatory changes are effected automatically.

It is, therefore, a primary object of the present invention to provide a superregenerative detector circuit which has a stable mode of operation which is unaffected by variations in supply potentials, or minor changes in circuit elements.

Another object of the present invention is to provide an improved oscillator circuit which is not subject to squegging or self-quenching.

Still another object of the present invention is to provide a superregenerative receiver having a substantially constant sensitivity over a wide tuning range.

A further object of the invention is to provide means for automatically controlling regeneration in a superregenerative receiver circuit, or in oscillators generally.

Figure 2:
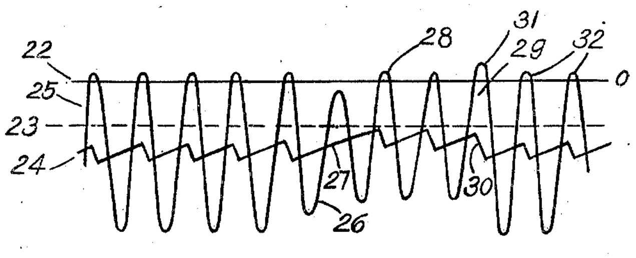

These and other objects of the invention will subsequently become apparent by reference to the following description taken in connection with the accompanying drawings, wherein Fig. 1 is a schematic circuit diagram of a superregenerative receiver circuit constructed in accordance with the principles of the present invention; and Fig. 2 is an explanatory diagram representing the effects of the novel combination of R—C circuits employed in the embodiment of Fig. 1.

Reference may now be had to the improved superregenerative circuit shown schematically in Fig. 1. Basically, this circuit comprises a Hartley oscillator 1, a square wave generator 2 for supplying a suitable quenching voltage wave, and a signal detector circuit 3 for rectifying a portion of the signal developed by the oscillator 1.

The Hartley oscillator 1 is, in part conventional, but includes a novel grid biasing arrangement which greatly improves the performance of the oscillator, per se, and the efficiency and stability of the superregenerative system in general. The oscillator circuit comprises a vacuum tube 4 having triode elements associated with a resonant tank circuit consisting of an inductance 5 and condenser 6. The connections between the electrodes of the triode 4 and the tank circuit are conventional. Although a direct current source of plate voltage may be provided for the oscillator tube 4 if desired, it is preferred to omit this, and to derive the necessary plate power from the square wave generator 2 which functions, in a manner well known in the art, both as a quenching voltage source and as a plate power source. A radio frequency choke coil 7 is preferably included in the connection between the high voltage terminal of the square wave generator 2 and the anode of the triode 4. A by-pass condenser 8 is connected between the anode of triode 4 and the grounded terminal of the tank circuit 5—6. This condenser provides a low impedance path for currents at the operating frequency of the oscillator, but should present a relatively high impedance at the quenching frequency. A suitable antenna system 9 may be coupled, conductively or otherwise, to the tank circuit 5—6.

While a square wave quenching voltage generator has been specifically described and illustrated, it will be understood, of course, that the wave shape employed is not a critical factor, and the present invention is not limited to the use of any specific wave form.

Instead of the conventional type of grid biasing circuit comprising a single grid leak and grid condenser, there is provided what may be referred to as a compound leak and condenser circuit. In general, this compound R—C circuit comprises a pair of R—C circuits in combination, one having a very long time constant, and the other having a very short time constant. In the drawing the grid condenser 10 and the grid leak 11 occupy conventional physical positions in the circuit, but the time constant of this combination is much smaller than would be (or could be) conventionally employed. Preferably, the capacity of the condenser 10 is small, e. g. of the order of magnitude of the tube capacitances. By way of example, a condenser might be selected whose capacitance was about that of the capacity of the grid to the cathode and plate. The leak resistance 11 is preferably so chosen that the time constant of the combination 10—11 is less than the time constant of the tank circuit 5—6. (The time constant of a parallel resonant circuit is equal to the ratio of twice the inductance of the circuit to the series resistance of the circuit.) Where resistance 11 is very small it may be advantageous to insert an inductance 12, self-resonant at the carrier frequency, in series with the resistor 11 as shown. The purpose of this is to increase the impedance presented by the grid biasing circuit to currents of carrier frequency. The optimum magnitudes for the elements 10, 11 and 12 are, of course, best determined by trial for each specific circuit.

The remaining element of the compound R—C circuit consists of the parallel combination of a resistor 13 and a condenser 14, the said combination having a relatively long time constant. By means of switch 15 the lower end of this combination may be connected either to a source of positive potential 16 (as shown), or directly to the grounded end of the resonant tank circuit 5—6.

In one experimental embodiment of the circuit of Fig. 1, which was constructed and arranged to operate with signal frequencies of the order of 300 megacycles, and a quenching frequency of approximately 30 kilocycles, the condenser 10 had a capacity of 50 micromicrofarads and the resistor 11 had a resistance of 5000 ohms. This combination provides a time constant of about a quarter microsecond. In the same embodiment the resistor 13 and the condenser 14 had the values 2 megohms and 0.5 microfarads respectively. The time constant of the latter circuit was therefore about 1 second. In general the time constant of this circuit should be long compared to the period of the lowest modulation frequency to be received. The presence of the self-resonant choke coil 12 has, of course, no effect on the magnitude of either of these time constants.

As is well known, the superregenerative circuit 1 may be used both as oscillator and detector. However it is preferred to provide an entirely separate detector circuit 3 which rectifies a portion of the high frequency oscillation developed by the oscillator. This detector may comprise a diode circuit coupled to the tank coil, or it may comprise a biased detector arrangement or a crystal or, indeed, any convenient type. In the drawing the detector 3 comprises a diode 17 having a load circuit 18—19 and a pair of output terminals 20. Where the superregenerative system is adjusted to operate in accordance with the separate quenching, logarithmic mode, the detector 3 should not be designed to operate as a peak detector, since in the mode referred to each train of oscillations builds up to the same amplitude lever substantially regardless of the amplitude of the received signals. The detector 3 is therefore preferably constructed and arranged to operate as a pulse integrating detector. In practice such operation is obtained by employing a load condenser 19 which is much smaller than would be employed for peak detection.

Reference will now be made to the modus operandi of the system hereinbefore described. Preferably the superregenerative circuit of Fig. 1 is adjusted to operate in accordance with what is generally known as the "separate quenching, logarithmic mode". As stated in Terman—"Radio Engineers Handbook," 1943, McGraw-Hill Book Company, page 662, in separately quenched systems an oscillator (in Terman's terminology the square wave generator 2) alternately allows oscillations to build up in the regenerative circuit and then causes them to die out, or to be "quenched". In the logarithmic mode, the operating conditions are so chosen that the oscillations are able to build up to an equilibrium value before being quenched. In the presence of an incoming signal this equilibrium value is reached sooner, and hence the area under the envelope of the oscillations produced by the oscillator 1 is increased. If the oscillations are rectified by a suitable detector, the detector output will supply an indication of the incoming signal.

While the conventional grid leak and grid condenser arrangement of prior superregenerative receivers was effective, to some degree, in providing a relatively constant mode of oscillation, and hence relatively constant sensitivity, it was found that the previous circuits were frequently unsatisfactory. In the circuit described with reference to Fig. 1, the compound R—C circuit arrangement maintains the mode of oscillation and the sensitivity practically constant and unaffected by tuning, tube replacements, normal variations in supply voltages, or minor circuit changes. In the compound R—C circuit arrangement, the long time constant circuit 13—14 tends to maintain constant grid current, and hence automatically adjusts the bias of the oscillator so as to maintain the average "starting time" at a constant value. The starting time is easily adjusted by adjustment of the resistor 13.

The combined effect of the two R—C circuits

10—11 and 13—14 which comprise the compound R—C circuit of the present invention, will best be understood by referring to Fig. 2, which is a simplified illustration of the control action effected by the compound R—C circuit over a number of cycles of the oscillator operating frequency. The zero axis 22 may be taken to represent ground potential which, as is evident from Fig. 1, is also the direct current potential of the cathode of triode 4. The negative grid bias which is due to the long time constant R—C circuit 13—14, is represented by the dashed-line 23. Due to the very long time constant of this circuit the negative bias produced thereby is relatively fixed, and consequently the dashed-line 23 is straight, and parallel to the zero line 22. The negative bias due to the R—C circuit 10—11 of short time constant is denoted by the difference between the dashed-line 23 and the solid line 24; the overall bias is, of course, that denoted by the solid line 24. The high frequency component of voltage present at the grid of triode 4 is denoted at 25, and it will be evident that this signal oscillates about the solid line 24 as a zero axis. As will be evident from the drawing, the condenser 10 receives a small negative charge during the peak portion of each positive alternation of the oscillator voltage. This charge is represented by the short, steep portions of the line 24. The condenser 10 then discharges as shown until it is again charged by a subsequent positive alternation. Should the amplitude of the generated wave suddenly decrease, as shown at 26, the condenser 10 will discharge as shown at 27, the discharge continuing until the voltage across the condenser 10 has decreased to the point where, as at 28, the grid again swings slightly positive with respect to the zero line 22 and normal operating conditions are restored. When the amplitude of the wave 25 increases, as at 29, the condenser 10 receives a larger-than-normal charge 30 due to the greater-than-normal positive excursion 31 of the grid electrode, and in consequence the overall grid bias is increased sufficiently to maintain at a substantially constant value the subsequent positive excursions 32 of the grid. Because of the action of the short time constant circuit 10—11, flow of grid current is insured, and tank circuit excitation maintained, for practically all positive alternations of the oscillator voltage wave, thus effectively preventing squegging, and insuring constant regeneration and a fixed mode of oscillation and sensitivity. It will be understood that the mode of operation illustrated in Fig. 2, while qualitatively representative of the operation of the circuit of Fig. 1, is not necessarily accurate quantitatively. For example, it is preferred that the constants of the compound R—C circuit be so selected that the grid-bias contribution of the short time constant circuit 10—11 is only one-fifth to one-tenth that of the contribution of the long time constant circuit 18—19.

As has been indicated above, the compound biasing circuit, illustrated in conjunction with the superregenerative receiver of Fig. 1, is also adapted for use with oscillators generally. A few remarks will suffice to explain this more general application of the invention. The term "bias" is here employed as referring to the amount by which the grid of the oscillator is more negative than the cathode. Under practical conditions, the excitation of an oscillator decreases with increasing bias, approaching zero as a limit, which limit it never reaches. With fixed bias the excitation increases rapidly with increasing R. F. tank voltage. If the grid time constant be too long, then a sudden momentary decrease in R. F. tank voltage will effect a reduction of excitation, which will cause a still further decrease in the R. F. voltage, which further reduces the excitation, until finally the oscillator may be left with a large grid bias, but no R. F. tank voltage whatever. The system, accordingly, has ceased to oscillate, and will remain in this passive condition until the grid bias decays sufficiently to permit oscillation to recommence.

In order to prevent such an unstable mode of operation (frequently termed squegging or self-quenching) it has been found that the time constant of the grid leak, grid condenser circuit must be shorter than the decay time constant of the tank circuit. However since a simple grid bias circuit of such very short time constant would be impractical, the present invention contemplates the use of a compound R—C circuit arrangement, one R—C circuit having a very long time constant, and the other having a very short time constant. The short time constant circuit, in the event of a diminution of R. F. tank voltage, causes a correspondingly rapid diminution of grid bias, thus increasing the excitation and preventing a further R. F. voltage decrease. The long time constant circuit preferably provides the greater portion of the total grid bias, and tends to maintain the grid current constant over a long period of time.

Although the present invention has been described with particular reference to a single embodiment, it will be understood that the invention is capable of various forms of physical expression, and consequently is not limited to the specific disclosure, but only by the scope of the appended claims.

I claim:

1. In a vacuum tube oscillator having a resonant circuit operatively connected to a tube having at least a grid, a cathode, and an anode, the improvement which consists in the provision of a grid biasing circuit connected to said grid and comprising a first R—C circuit having a time constant which is smaller than the decay time constant of said resonant circuit, and a second R—C circuit having a time constant which is very large compared to the time constant of said first-mentioned R—C circuit.

2. In a vacuum tube oscillator having a resonant circuit operatively connected to a tube having at least a grid, a cathode, and an anode, said oscillator being subject to periodic variations in its mode of oscillation, the improvement which consists in the provision of a grid biasing circuit connected to said grid and comprising a first R—C circuit whose time constant is smaller than the decay time constant of said resonant circuit, and a second R—C circuit whose time constant is long compared to the period of said periodic variations.

3. A superregenerative detector circuit comprising a resonant circuit, a vacuum tube operatively coupled to said resonant circuit so as to provide an oscillator circuit, a grid capacitor having a value of the order of the inter-electrode capacitance of said tube, a grid leak resistor having a value such that the time constant of the grid leak and capacitor circuit is less than the decay time constant of said resonant circuit, a time constant circuit connected in series with said grid leak resistor, the time constant of said last-named circuit being large compared to the time of one cycle of the lowest modulation frequency to be received, and means for periodically quenching said detector circuit to cause oscillations in said resonant circuit periodically to subside.

4. A superregenerative detector circuit comprising a vacuum tube connected in an oscillatory circuit, a grid capacitor and grid leak resistor arrangement having such values that the time constant thereof is less than the decay time constant of said oscillatory circuit, a time constant circuit connected in series with said grid leak resistor and having a time constant large compared to the time of one cycle of the lowest modulation frequency to be received, and means for periodically reducing the plate potential of said vacuum tube to such value as to permit oscillations in said oscillatory circuit periodically to subside.

5. A superregenerative detector circuit comprising a vacuum tube connected in an oscillatory circuit, a grid capacitor and grid leak resistor arrangement having such values that the time constant thereof is less than the decay time constant of said oscillatory circuit, a time constant circuit connected in series with said grid leak resistor and having a time constant large compared to the time of one cycle of the lowest modulation frequency to be received, and means for periodically quenching oscillations of said oscillatory circuit.

6. A superregenerative detector circuit comprising an oscillatory circuit, a vacuum tube therein, a grid capacitor and leak arrangement having a shorter time constant than the decay time constant of said oscillatory circuit, a circuit connected in series with said grid leak to maintain substantially constant grid current, and a source of quenching potential for the anode circuit of said tube.

7. A superregenerative receiver comprising a resonant circuit, a vacuum tube operatively connected thereto so as to provide an oscillator circuit, said tube having an anode, a cathode and a grid, a grid capacitor and leak arrangement having a time constant shorter than the decay time constant of said resonant circuit, time constant means connected in series with said grid leak to maintain substantially constant grid current over long periods of time, a source of quenching potential operatively connected to said tube, and a separate detector stage conductively coupled to an intermediate point on said resonant circuit.

8. A vacuum tube oscillator comprising a resonant circuit, a vacuum tube having at least a cathode, a grid, and an anode, connections including a grid coupling condenser for operatively interconnecting said resonant circuit and said vacuum tube, a pair of grid leak resistors connected in a direct current circuit between said cathode and said grid, both of said resistors being external to the anode current circuit of said tube, one of said grid leaks having a resistance which is very large compared to that of the other, a large condenser connected in shunt with said grid leak of large resistance to provide an R—C circuit of long time constant, said grid coupling condenser and said grid leak of small resistance constituting an R—C circuit of short time constant less than the decay time constant of said resonant circuit.

WILLIAM E. BRADLEY.

REFERENCES CITED

The following references are of record in the file of this patent:

UNITED STATES PATENTS

| Number | Name | Date |
|---|---|---|
| 1,424,065 | Armstrong | July 25, 1922 |
| 2,022,063 | Wheeler | Nov. 26, 1935 |
| 2,076,168 | Turner | Apr. 6, 1937 |
| 2,104,801 | Hansell | Jan. 11, 1938 |
| 2,147,595 | Hilferty | Feb. 14, 1939 |
| 2,226,657 | Bly | Dec. 31, 1940 |
| 2,379,694 | Edson | July 3, 1945 |
| 2,407,394 | Birr | Sept. 10, 1946 |